United States Patent
Ito et al.

(10) Patent No.: US 7,947,602 B2
(45) Date of Patent: May 24, 2011

(54) CONDUCTIVE PATTERN FORMATION METHOD

(75) Inventors: Chizuko Ito, Kitsuki (JP); Mutsumi Masumoto, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 198 days.

(21) Appl. No.: 12/033,653

(22) Filed: Feb. 19, 2008

(65) Prior Publication Data

US 2008/0199988 A1      Aug. 21, 2008

(30) Foreign Application Priority Data

Feb. 21, 2007   (JP) ................. 2007-040270

(51) Int. Cl.
*H01L 21/44* (2006.01)

(52) U.S. Cl. ............ 438/687; 257/E21.48; 257/E21.519

(58) Field of Classification Search .................. 438/119, 438/615, 687; 29/825, 829, 835, 839, 844, 29/853, 875, 882, 838; 257/E21.48, E21.519

See application file for complete search history.

(56) References Cited

U.S. PATENT DOCUMENTS

| | | | |
|---|---|---|---|
| 5,244,538 | A | 9/1993 | Kumar |
| 5,262,594 | A | 11/1993 | Edwin et al. |
| 6,180,509 | B1 | 1/2001 | Huang et al. |
| 6,454,153 | B2 | 9/2002 | Bettinger et al. |
| 6,500,753 | B2 | 12/2002 | Jang et al. |
| 6,541,848 | B2 | 4/2003 | Kawahara et al. |
| 6,653,171 | B2 | 11/2003 | Ikegami |
| 7,611,040 | B2 * | 11/2009 | Kitae et al. ............ 228/180.22 |

FOREIGN PATENT DOCUMENTS

JP          11-345837          12/1999

* cited by examiner

*Primary Examiner* — W. David Coleman (74) *Attorney, Agent, or Firm* — Yingsheng Tung; Wade J. Brady, III; Frederick J. Telecky, Jr.

(57) ABSTRACT

The objective of the present invention is to offer a method for forming a conductive pattern on a substrate and solder protrusions on the conductive pattern. The pitch of the conductive pattern corresponds to the pitch of electrodes on a semiconductor chip.

8 Claims, 7 Drawing Sheets

CONDUCTIVE PATTERN FORMATION METHOD

FIELD OF THE INVENTION

The present invention relates to a method which forms conductive patterns on top of a substrate, and in particular, relates to a method in which copper patterns that are formed on the substrate used for a flip chip are solder plated.

BACKGROUND OF THE INVENTION

Accompanying the popularization of portable telephones, portable computers, and other small electronic devices, the demand for increasingly miniaturized and thinner devices which contain semiconductor elements has increased. In order to answer this demand, the BGA package and the CSP package have been developed and put into practical use. For example, in Japanese Kokai Patent No. Hei 11[1999]-345837, a method for the manufacture of a BGA package is disclosed in which the semiconductor chip is a flip chip or is made to face down, and an underfilling processing is performed between the substrate and the semiconductor chip.

In the case of the flip-chip mounting of a semiconductor chip, on the substrate side, wire patterns are formed that correspond with the electrode pads or the electrode bumps of the semiconductor chip. If the wiring pitch and the electrode pitch on top of the semiconductor chip are made small, the pitch and the surface area of the wiring pattern on the substrate side corresponding to it must be made small.

Figure 7A:
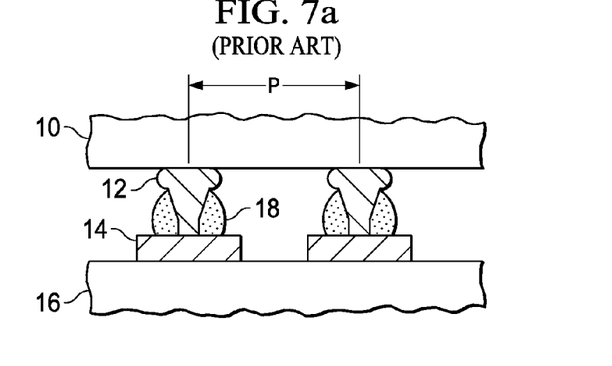
FIG. 7(a) and FIG. 7(b) are cross-sectional views used to explain the connections between a semiconductor chip and a substrate used for flip-chip mounting of the prior art.
Figure 7B:
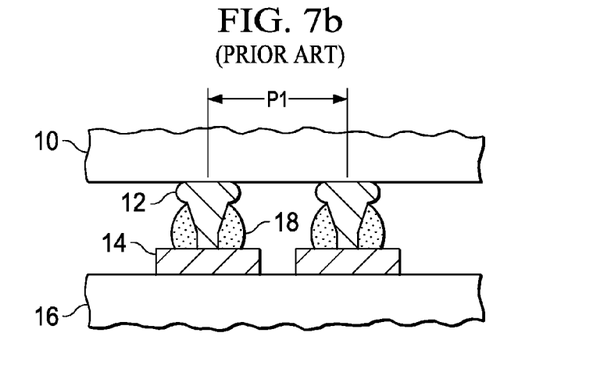

In the case of flip-chip mounting, for example, as shown in FIG. 7(a), on the rear surface of a semiconductor chip 10 stud bump electrodes 12 are formed at a pitch (P); and on the other hand, on top of a substrate 16, a copper pattern 14 is formed to correspond to said pitch (P), and on top of the copper pattern 14, a solder plating 18 is formed; both are bonded by projecting the stud bump electrodes 12 into the solder plating 18. The bonded section is aligned by melting the solder plating 18. Also, if the semiconductor chip 10 is miniaturized, the pitch (P1) of the stud bump electrodes 12, as shown in FIG. 7(b), becomes narrow, and the pitch and line width of the copper pattern 14 are made small accordingly.

Figure 8A:
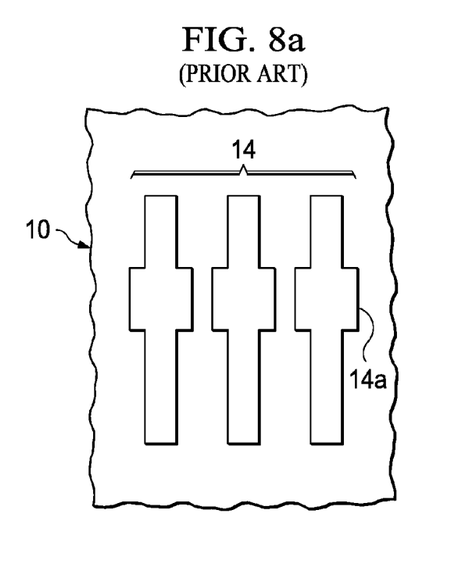
FIG. 8(a), FIG. 8(b), FIG. 8(c), FIG. 8(d) and FIG. 8(e) are diagrams showing the process for forming a copper pattern used in the prior art.
Figure 8B:
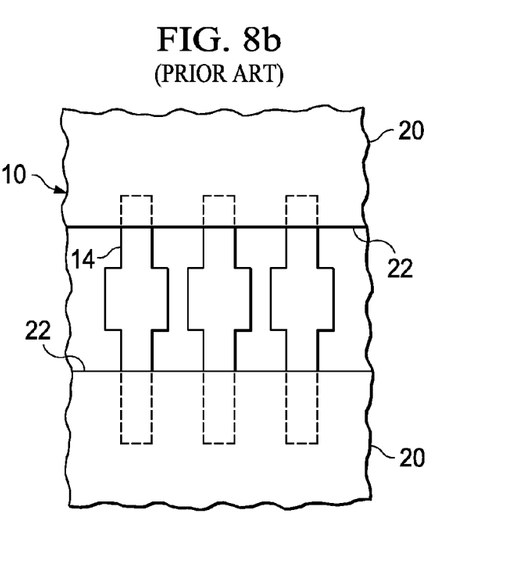

The method of forming the solder plating on top of the copper pattern is explained as follows. As shown in FIG. 8(a), the copper pattern 14 is formed with a constant pitch on top of the substrate 10. On this copper pattern 14, a wide region 14a is formed. Next, as shown in FIG. 8(b), a solder mask 20 is formed on top of the substrate. Apertures 22 are formed in the solder mask 20, and the portions of the copper pattern 14 containing the wide region 14a are exposed by the apertures 22. Next, as shown in FIG. 8(c), a powder or granular form of solder 24 is adhered on top of the copper pattern 14 through the apertures 22 of the solder mask 20.

Figure 8C:
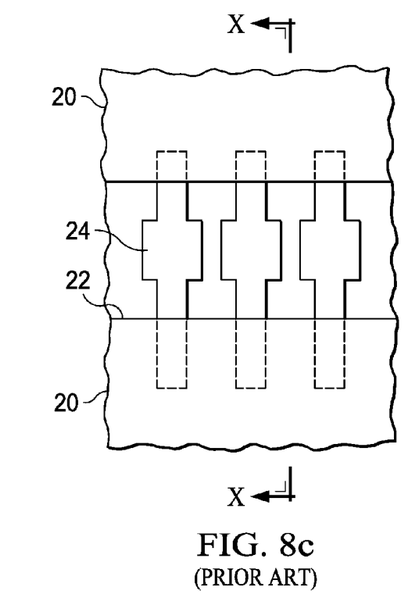
Figure 8D:
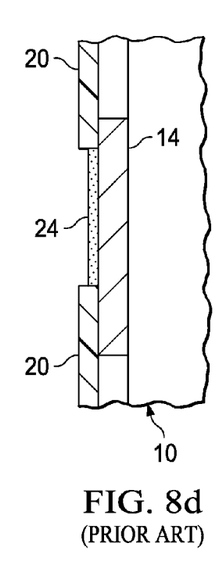
Figure 8E:
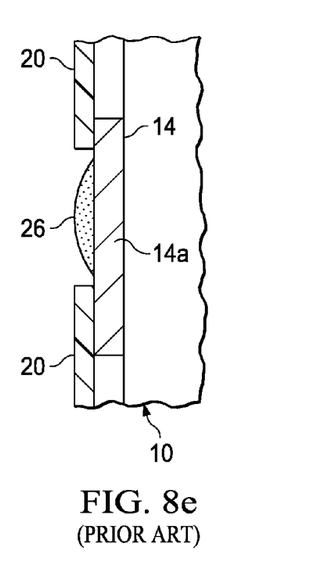

FIG. 8(d) depicts a cross-sectional view of FIG. 8(c) through line X-X. The granular solder 24 is adhered approximately uniformly on the exposed copper pattern 14. Next, as shown in FIG. 8(e), the solder 24 is reflowed at a temperature. Because the surface area of the wide region 14a is greater than the surface area of the other regions, the majority of the solder collects in the wide region 14a; and the melted solder forms the solder protrusions or bumps 26 at the wide region 14a due to its surface tension.

Figure 9A:
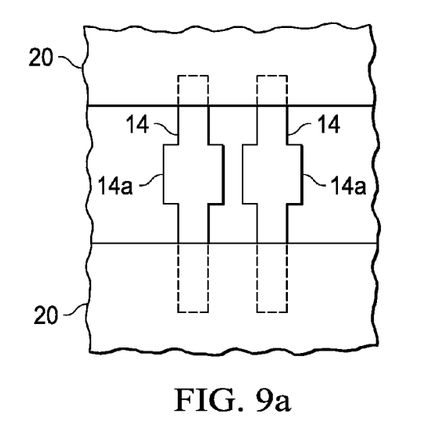
FIG. 9(a) and FIG. 9(b) are diagrams used to explain the problems of the copper pattern used in the prior art.

When solder plating is formed with this method, there are the following problems. The copper pattern 14 on top of the substrate is formed by an etching process using a mask, or by an electroless plating method. Either way, there are limits to the processing precision of the copper pattern. And if the pitch of the copper pattern is made less than 40 µm, as shown in FIG. 9 (a), it is difficult to control the spacing of the wide regions 14a, and as a consequence, wide region 14a comes in contact with the adjacent wide region 14a, so that there are instances in which the copper pattern is completely shorted.

Figure 9B:
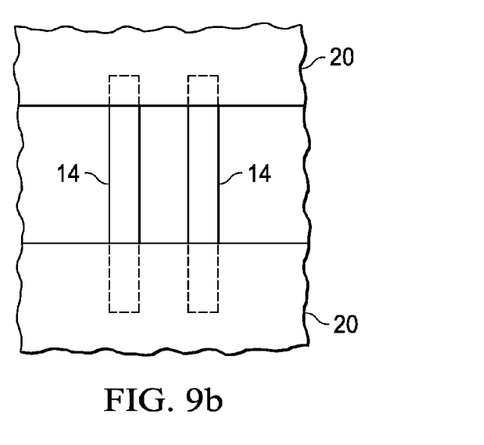

On the other hand, as shown in FIG. 9(b), if the wide regions are not formed on the copper pattern 14 and it has a straight shape, it is possible to make the copper pattern correspond to a narrow pitch. But when the solder powder adhered on top of the copper pattern of this straight shape is reflowed, variations are generated in the positions at which the solder protrudes and in the height at which the solder protrudes, so that positive bonding of the stud bump electrodes of the semiconductor chip to the solder cannot be performed, which produces poor connections.

SUMMARY OF THE INVENTION

The present invention is a method which solves the above-mentioned problems of the prior art, and its purpose is to offer a method for forming a conductive pattern, a semiconductor device manufacturing method, and a semiconductor device in which the conductive pattern corresponds to the minute changes in pitch of the semiconductor chip electrodes.

The method for forming a conductive pattern related to the present invention includes a process which forms a plurality of conductive patterns made of copper or a copper alloy on top of one surface of a substrate, a process which presses in the thickness direction a portion of each conductive pattern to form a wide region of one portion of the conductive pattern, a process which adheres a solder powder on top of each conductive pattern, and a process which melts the solder powder that has adhered on top of the conductive pattern.

Furthermore, another method for forming a conductive pattern related to the present invention includes a process which forms a plurality of conductive patterns made of copper or a copper alloy on top of one surface of a substrate, a process which forms a mask on top of the substrate having an aperture pattern corresponding to the plurality of conductive patterns, and which exposes a portion of each conductive pattern by means of the aperture pattern, a process which adheres a solder powder on top of the exposed conductive patterns, and a process which melts the solder powder; the aperture pattern contains an aperture surface area in the center section that is greater than the aperture surface area of the edge sections, and the exposed surface area of the conductive pattern due to the center section of the said aperture is also larger than the exposed surface area of the edge sections. Preferably, the distance from one edge of the aperture to the other edge of the aperture is less than about 50 µm, and the melted solder protrudes on top of the conductive pattern that is exposed due to the aperture pattern.

Also, the manufacturing method for a semiconductor device related to the present invention contains a process which connects the electrodes of a semiconductor chip to the conductive pattern that is formed by means of the above-mentioned forming method, and preferably, the electrodes of the semiconductor chip are gold stud bumps. Also, a process includes an underfill being inserted between the semiconductor chip and one surface of the substrate.

The semiconductor device related to the present invention is constructed by the above-mentioned manufacturing method for a semiconductor device, and preferably includes bump electrodes at the electrodes.

BRIEF EXPLANATION OF THE DRAWINGS

FIG. 5(a), FIG. 5(b), FIG. 5(c), and FIG. 5(d) are diagrams illustrating the aperture pattern of a solder mask that is used in Embodiment 2.

REFERENCE NUMERALS AND SYMBOLS AS SHOWN IN THE DRAWINGS

In the drawing figures 100 represents a substrate, 110 represents a copper pattern, 112 represents a region in which the surface area is widened, 120 represents a solder mask, 122 represents an aperture, 130 represents a pressing component, 140 represents solder powder, 142 represents solder plating, 144 represents a solder protrusion, 200 represents a solder mask, 210, 220 represent aperture patterns, 214 represents a solder protrusion, 212, 222, 230 represents apertures.

DESCRIPTION OF THE EMBODIMENTS

According to the present invention, the necessity of forming a conductive pattern having wide regions during the formation of the conductive pattern is eliminated, and the formation of a semiconductor pattern with a narrower pitch can be performed. Also, because the wide regions of the conductive pattern are formed by means of pressing the conductive pattern, the process can be simplified. Alternatively, by making the exposed surface area of the conductive pattern larger in the center section than in the edge section of the aperture, the surface area at which the solder powder is adhered becomes large in the center section of the aperture, and by this means, the formation of solder protrusions in a fixed region of each conductive pattern can be achieved.

Preferred embodiment configurations of the present invention are explained below in detail with reference to the drawing figures. Here, a semiconductor device in which a flip chip is mounted is used in the example.

Figure 1:
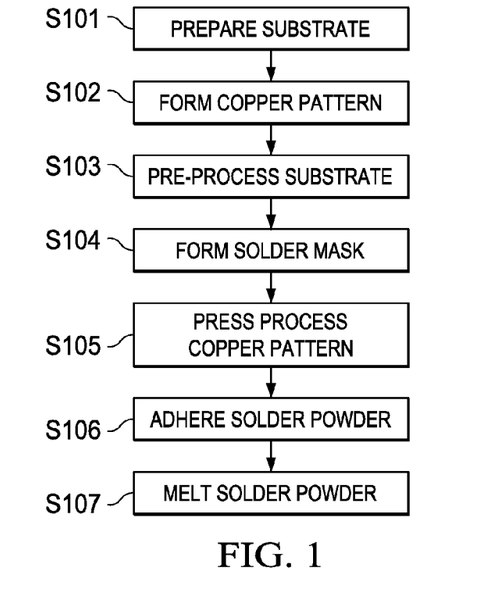
FIG. 1 is a flowchart showing the process for forming a copper pattern a substrate related to Embodiment 1 of the present invention.

FIG. 1 is a flow chart showing the method for forming a copper pattern related to Embodiment 1 of the present invention. First, a substrate used for a flip chip is prepared (Step S101). The substrate, for example, can be a laminated substrate made of glass and epoxy resin, or a tape substrate made of a polyimide resin, or the like, can be used.

Next, on top of the substrate, a copper pattern is formed (Step S102). The copper pattern is formed with a pitch corresponding to the pitch of the electrodes on the semiconductor chip surface that is flip chip mounted, and is formed with a width in response to the size of the electrodes. The copper pattern is formed by means of electroless plating or etching.

Figure 2A:
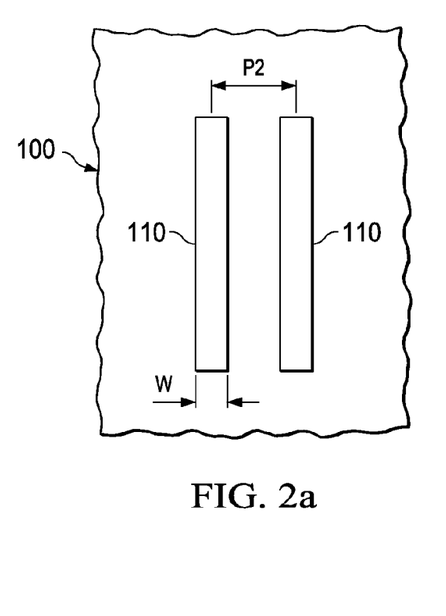
FIG. 2(a), FIG. 2(b), FIG. 2(c), and FIG. 2(d) are diagrams used to explain the process for forming a copper pattern in Embodiment 1.

FIG. 2(a) shows one example of a copper pattern (only two copper lines are depicted). As shown in the same figure, a copper pattern 110 is formed on top of a substrate 100, and its shape is a straight shape. The pitch (P2) is, for example, 40 µm, and the line width (W) is 20 µm.

Next, the substrate is pre-processed for plating (Step S103). Preferably, the substrate is lightly etched and the surface is cleaned; then, an adhesive film is formed on the surface of the copper pattern by means of a chemical reaction by immersion in a chemical agent.

Figure 2B:
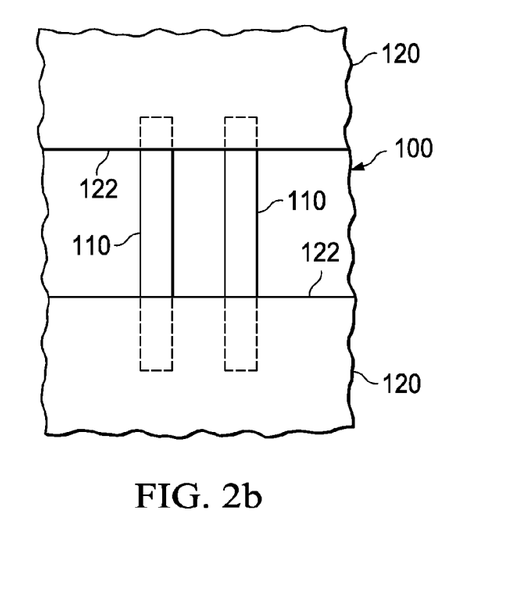

Next, a solder mask is formed on top of the substrate (Step S104). For the solder mask, a liquid resist is coated or a film is adhered on top of the substrate, and apertures are formed by using the photolithographic process. For example, an acrylate resin can be used. As shown in FIG. 2(b), a solder mask 120 that is formed on top of the substrate 100 contains the apertures 122, and a portion of the copper pattern 110 is exposed by the apertures 122.

Figure 2C:
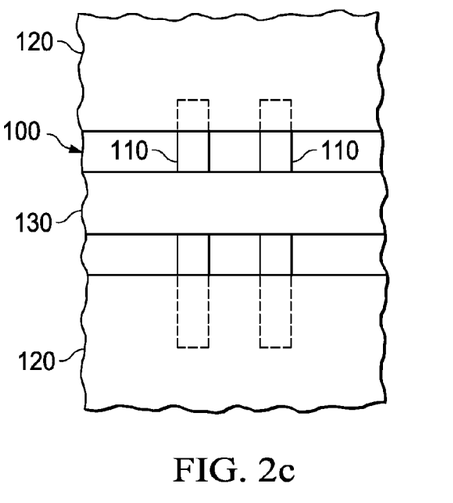
Figure 2D:
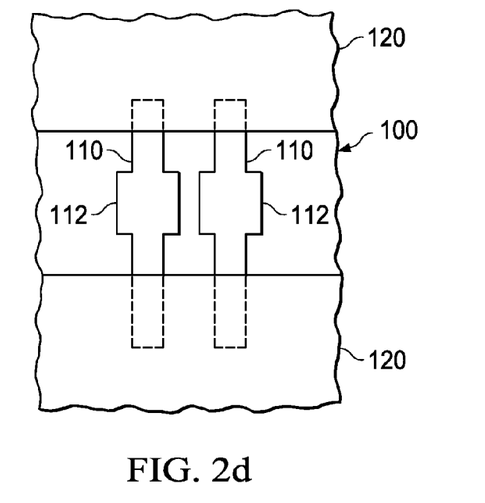

Next, the copper pattern is processed in a press (Step S105). The press is a device that presses a portion of the copper pattern in its thickness direction. The applied pressure forms a widened region in the copper pattern region, for example, as shown in FIG. 2(c). A pressing component 130 with a straight line shape having a flat surface is pressed uniformly with a fixed force on the copper pattern 110. By this means, as shown in FIG. 2(d), a region with a widened surface area or a wide region 112 is formed at approximately the center of the copper pattern 110. The size of the expansion can be conveniently selected by means of the pressing force or the shape of the pressing section of the pressing component 130. It is sufficient for example, if the width of the copper pattern 110 is 20 µm that the width of the wide region 112 is about 30 µm.

Figure 3A:
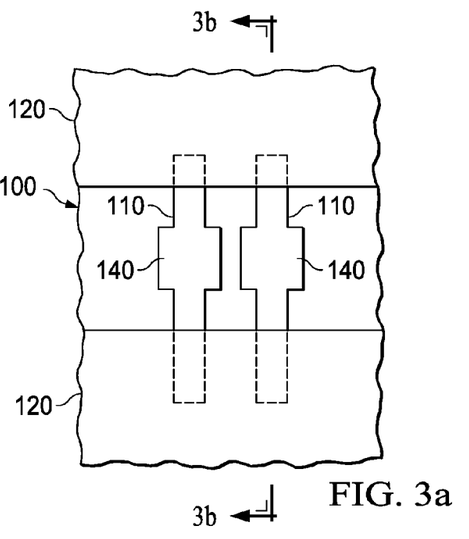
FIG. 3(a) and FIG. 3(b) are diagrams used to explain the process for forming a copper pattern in Embodiment 1.

Next, solder powder is adhered via the apertures 122 of the solder mask 120 (Step S106). The solder powder is preferably made of a lead-free substance, e.g., a tin alloy containing silver. As shown in FIG. 3(A), solder powder 140 is adhered on top of the copper pattern 110 that is exposed via the apertures 122 of the solder mask 120. The solder powder 140 is adhered only on top of the copper pattern 110, on which the adhesive film is formed.

Next, the solder powder is melted (Step S107). Preferably, a flux is applied on top of the solder powder to be melted. The solder powder 140 is heated, for example, to about 260 degrees, and melted. Due to the melting, a solder plating 142 is formed on the surface of the copper pattern 110. By means of this process, solder protrusions or bumps 144 are formed in the wide regions 112 of the copper pattern.

Figure 3B:
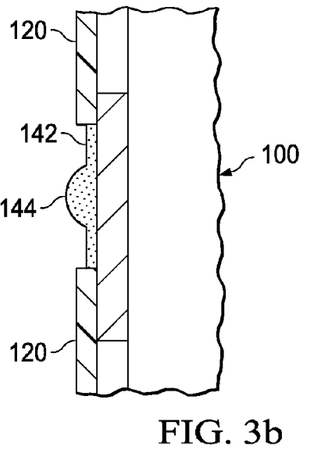

As shown in FIG. 3(b), because more solder powder is adhered in the wide region 112 of the copper pattern 110 than in the other regions, when the solder powder is melted, the protrusions 144 are formed due to the surface tension of the solder at the center of the wide region. The solder protrusions 144 are aligned in a straight line in the alignment direction of the copper pattern 110. Also, the height of the solder protrusions 144 that are formed in each copper pattern are nearly uniform, and are about 13.5±3 µm.

In this way, according to Embodiment 1, after the copper pattern is formed, since the copper pattern is pressed and made so as to form the wide regions 112, it is no longer necessary to form a copper pattern initially having wide regions; as a result, a copper pattern with a narrow pitch compared with the prior art can be formed. Furthermore, by aligning the solder protrusions in the wide regions of the copper pattern, the connection to the electrodes of the semiconductor chip can be formed reliably.

The method for forming a copper pattern according to Embodiment 2 of the present invention will now be explained In Embodiment 2, the copper pattern is not compressed as in Embodiment 1, and the surface area in which the solder powder is adhered is expanded by means of the aperture pattern of the solder mask.

Figure 4:
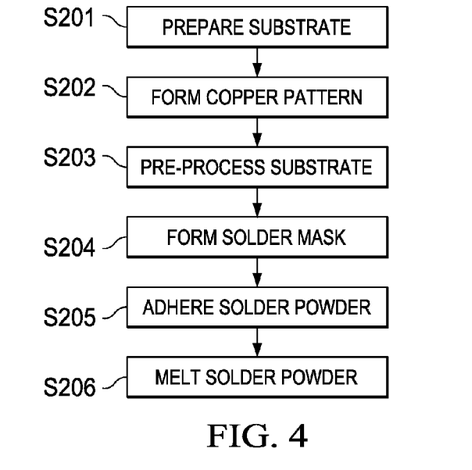
FIG. 4 is a flowchart showing the process for forming a copper pattern on a substrate related to Embodiment 1 of the present invention.

In the flow chart shown in FIG. 4, since Steps S201 to S203, S205, and S206 are the same as in Embodiment 1, repetitive explanation is omitted.

Figure 5A:
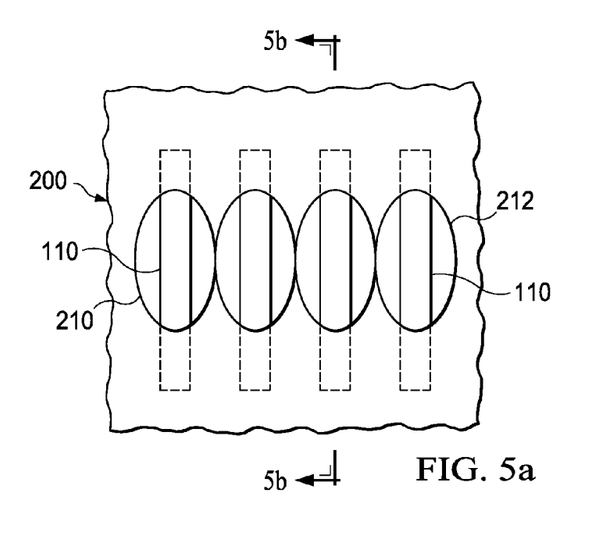
FIG. 5(a) is a plan view, FIG. 5(b) a cross-sectional view.
Figure 5B:
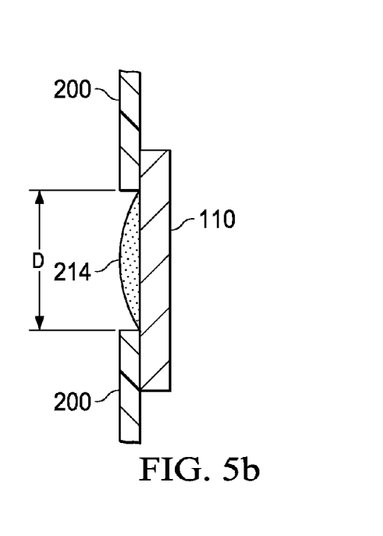

In Step S204, a solder mask is formed on top of the substrate. As shown in FIG. 5(a) and FIG. 5(b), a plurality of elliptical aperture patterns 210 are formed in solder mask 200. Each aperture 212 is aligned corresponding to the pitch of the conductive pattern 110. The long diameter (D) of the aperture 212 is preferably approximately equal to the size of the electrodes or electrode pads of the semiconductor chip that is flip-chip mounted. For example, if the electrode pads of the semiconductor chip are rectangular, and its length of one side is 100 μm, the long diameter (D) is designed to be 100 μm. If one side length is 50 μm, the long diameter (D) is designed to be 50 μm. Also, the short diameter of the aperture 212 is greater then the wire width the copper pattern, and a single copper line is exposed in each ellipse 212.

Because the aperture 212 is elliptical, the surface area of its center section is greater then the surface area at its edges; and the exposed surface area of the copper pattern 110 becomes larger in the center section than in the edge sections of the aperture 212. When the solder is reflowed, due to the surface tension of the solder that is concentrated in the locations with larger solder surface area, solder protrusions 214 form there.

Figure 5C:
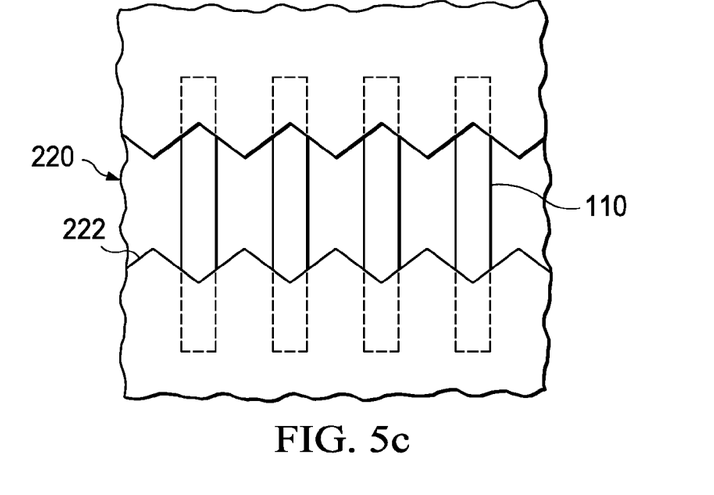
FIG. 5(c) and FIG. 5(d) are plan views showing other aperture patterns for the solder mask.

The aperture pattern of the solder mask can take on other shapes. For example, as shown in FIG. 5(c), the edge sections of apertures 222 of an aperture pattern 220 can form acute angles. In other words, the edges of the aperture 222 are triangular in shape, and the surface area of its center section is made larger than its edge sections. Also, the apertures 222 can be formed by linking to other apertures 222. In this way, the solder surface area of the center section of the aperture 222 becomes larger than the solder surface area of the edge sections in the copper lines, and solder bumps can be uniformly aligned in the locations with larger solder surface area.

Figure 5D:
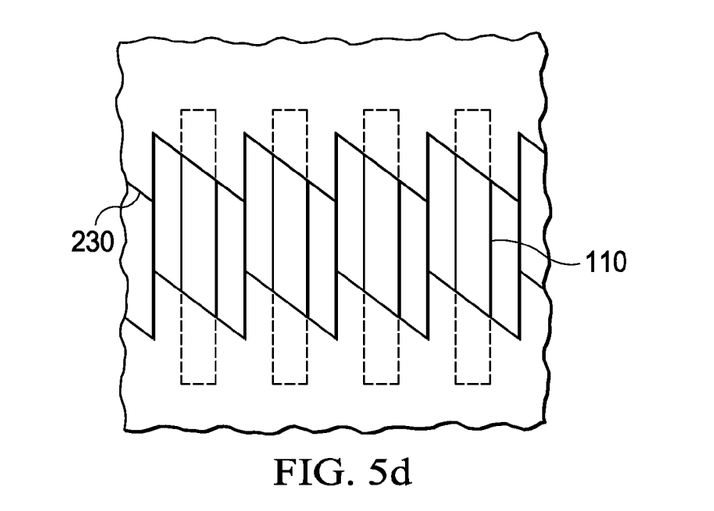

Also, in the aperture pattern of the solder mask, as shown in FIG. 5(d), diamond shapes 230 can be formed so as to be aligned in the alignment direction of the copper pattern. In this case also, the solder surface area of the center section is larger than the edge sections of the diamond shape, and solder protrusions can be aligned in the center section.

According to Embodiment 2, by varying the aperture surface area of the aperture pattern of the solder mask, most of the solder powder is made to adhere to the location with larger aperture surface area, and the solder protrusions can be formed there. It is also possible to combine Embodiment 2 with Embodiment 1. In this case, for example, after a solder mask such as that shown in FIG. 5(c) is formed, the copper pattern forms a wide region by compression processing, and the solder powder can then be adhered to the copper surface of the copper pattern.

Figure 6A:
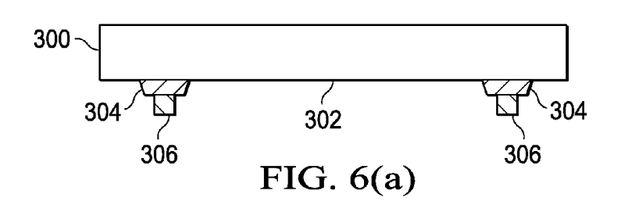
FIG. 6(a), FIG. 6(b), and FIG. 6(c) are diagrams showing the process for flip-chip mounting of a semiconductor chip on a substrate that is formed by means of the embodiments of the present invention.
Figure 6B:
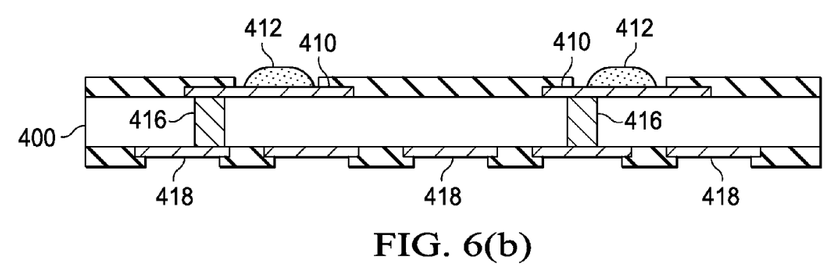
Figure 6C:
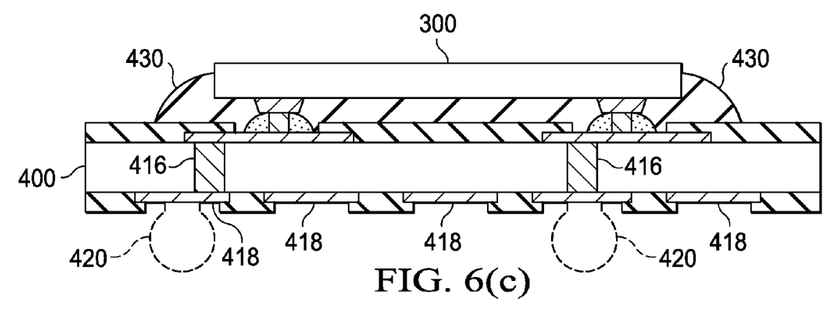

A semiconductor device manufacturing method employing the flip-chip mounting of a semiconductor chip on a substrate that is formed by means of Embodiment 1 or Embodiment 2 will now be explained. As shown in FIG. 6, on a principal surface 302 on which the integrated circuit of a semiconductor chip 300 is formed, multiple electrode pads 304 made from aluminum or an aluminum alloy are formed, and on the electrode pads 304, gold stud bumps 306 are formed. There are no particular limitations to the shape of the gold stud bumps 306; for example, they can be semi-circular, elliptical, or rectangular. Also, the gold stud bumps 306 have a height of more than about 20 to 60 μm from the principal surface 302, and are positioned with a pitch of 40 μm or less. In the figure, only two stud bumps are shown. The height of gold stud bump 306 is conveniently designed to correspond to the pitch of the electrode pads 304. Also, the stud bumps 306 can be formed from metals other than gold, for example, solder or the like.

A substrate 400 used for flip-chip mounting related to this embodiment, for example, is a laminated substrate, a copper pattern 410 on which solder plating has been formed on its upper surface, and on the copper pattern 410, solder protrusions (bumps) 412 are formed. The solder bumps 412 are arranged at positions corresponding to the electrode pads 304 or the gold stud bumps 306 of the semiconductor chip 300. The solder protrusions 412, preferably, are made of a lead-free material; for example, a tin alloy containing silver. The tin alloy can also contain copper, indium, bismuth, or the like. The copper pattern 410 is connected to an external electrode 418 that is formed on the rear surface of the substrate by means of internal wiring 416 of the substrate 400. A solder ball 420 used for BGA or used for CSP can be connected to the external electrode 418.

The gold stud bump 306 of the semiconductor chip 300 is connected to the solder protrusions 412 of the substrate 400, and the gold stud bump 306 and the solder plated copper pattern 410 are bonded by reflow soldering. At this time, a fixed spacing is formed between the semiconductor chip 300 and the substrate 400. Because the bonding condition of the gold stud bump 306 and the copper pattern 410 is brittle, a resin 430 used for underfilling is filled in the space between the principal surface 302 of the semiconductor chip 300 and the substrate 400 for reinforcement.

A detailed explanation was given in regard to a preferred embodiment configuration of the present invention, but the present invention is not limited to specific embodiments and various modifications—change are possible within the scope of the essence of the present invention within the scope of the patent claims.

What is claimed is:

1. A method for forming a conductive pattern comprising:
    forming a pattern of plurality of copper lines of a thickness on an upper surface of a substrate,
    pressing the copper lines in the direction of the thickness, forming a widened region in the copper lines, and
    disposing a solder powder on top of the copper lines.

2. The method of claim 1, in which the widening pressing step further includes aligning a pressing tool in a direction perpendicular to conductive lines, so that the widened are aligned perpendicular to the conductive lines.

3. The method of claim 1, further comprising forming a mask pattern on top of the substrate, exposing a portion of the conductive lines via an aperture in the mask pattern, and affixing a solder powder on top of the exposed conductive lines.

4. The method of claim 1 in which the solder powder contains tin and silver.

5. The method of claim 1, further comprising forming on an opposite surface of the substrate, a plurality of electrodes that electrically connected to the conductive lines.

6. A semiconductor device that is constructed by means of the semiconductor device manufacturing method of claim 1.

7. The method of claim 2 further comprising forming solder protrusions in the widened regions of the conductive lines.

8. The semiconductor device of claim 6 further comprising bump electrodes on an opposite substrate surface.

* * * * *